(12) United States Patent
DeSimone

(10) Patent No.: US 6,559,664 B2
(45) Date of Patent: May 6, 2003

(54) PROBE PLATE ASSEMBLY FOR A CIRCUIT BOARD TEST FIXTURE

(76) Inventor: Peter DeSimone, 62 Brookfield Dr., Cranston, RI (US) 02920

( * ) Notice: Subject to any disclaimer, the term of this patent is extended or adjusted under 35 U.S.C. 154(b) by 10 days.

(21) Appl. No.: 09/928,299

(22) Filed: Aug. 13, 2001

(65) Prior Publication Data

US 2003/0030454 A1 Feb. 13, 2003

(51) Int. Cl.$^7$ ............................................... G01R 31/02
(52) U.S. Cl. ...................... 324/754; 324/761; 324/158.1
(58) Field of Search ................................ 324/761, 754, 324/755, 158.1, 765

(56) References Cited

U.S. PATENT DOCUMENTS

| | | | | |
|---|---|---|---|---|
| 4,724,383 A | * | 2/1988 | Hart ............................ | 324/754 |
| 4,799,007 A | | 1/1989 | Cook et al. | |
| 5,283,518 A | * | 2/1994 | King et al. ................. | 324/761 |
| 5,304,921 A | | 4/1994 | Cook et al. | |
| 5,389,874 A | | 2/1995 | King et al. | |
| 5,773,988 A | * | 6/1998 | Sayre et al. ................ | 324/761 |
| 6,005,405 A | * | 12/1999 | Slutz ........................... | 324/761 |
| 6,047,469 A | * | 4/2000 | Luna ............................ | 29/830 |
| 6,208,158 B1 | * | 3/2001 | Schein et al. ................ | 324/761 |

* cited by examiner

*Primary Examiner*—Kamand Cuneo
*Assistant Examiner*—Tung X. Nguyen

(57) ABSTRACT

An enhanced probe plate assembly for a circuit board test fixture is disclosed. A conductive surface or surfaces is laminated to the underside of a probe plate assembly located between an electrical test system and circuit board under test. These conductive surface(s) of the probe plate assembly provide an improved interface between the signal probes and personality pins of the circuit board test fixture and can be used for grounding planes, voltage sources, and common interconnection grids. The enhanced probe plate assembly results in increased signal quality due to reduced signal path length, less crosstalk and signal loss between personality pin and signal probe connections, and perfect alignment of personality pins and signal probes through the conductive surface. It is emphasized that this abstract is provided to comply with the rules requiring an abstract, which will allow a searcher or other reader to quickly ascertain the subject matter of the technical disclosure. It is submitted with the understanding that it will not be used to interpret or limit the scope or meaning of the claims. 37 CFR 1.72(b).

11 Claims, 3 Drawing Sheets

PROBE PLATE ASSEMBLY FOR A CIRCUIT BOARD TEST FIXTURE

FIELD OF THE INVENTION

This invention relates generally to the testing of printed circuit boards and, more particularly, to board test fixtures and other mechanical interfaces for electrically interconnecting electronic circuit boards and the like to electrical test systems.

BACKGROUND OF THE INVENTION

A board test system consists of numerous electronic drivers (sources) and receivers (detectors) which are connected through an electronic switching mechanism, or scanner, to a plurality of contact points referred to as scanner pins. A board test fixture then provides an interface between these scanner pins and the electronic components located on an electronic circuit board. Because the electronic test signals which are used to determine whether the electronic component is operating properly must pass through the board test fixture both on their way to and from the electronic component, the board test fixture must maintain the signal quality of the test signals to ensure that the electronic component is not incorrectly diagnosed as operating either properly or improperly. It has been recognized in the art that in order to ensure maximum test signal quality, the length of the signal path between the scanner and the electronic circuit board must be kept as short as possible. The factory normally dictates a short vertical coupling of the test system and the circuit board. In other words, a "short-wire" board test fixture is designed to sit directly on top of the scanner and the electronic circuit board directly on the board test fixture. Furthermore, any board test fixture must be easy to assemble and maintain in order to be readily usable and cost effective. Finally, the ability to automate the assembly of the fixture is also an important feature. Prior art short-wire length test fixtures such as U.S. Pat. No. 5,304,921, issued to Cook et al, have a common configuration. Referring to the Cook prior art of FIG. 1, a circuit board 202 to be tested is placed on top of a board test fixture 204 via the guidance of an alignment pin 205. The board test fixture 204 provides an electrical interface between the circuit board 202 and the board test system 206. In other words, many test signals travel through the board test fixture 204. The Cook invention implements a grounding system which utilizes ground coax assemblies 208 and a plated alignment plate 210 in the board test fixture 204, as are described in detail below.

Various test signal paths travel from the board test system 206 through the board test fixture 204 to electronic components 212, 214 on a circuit board 202 under test. As shown in FIG. 1, for example, a test signal from the board test system 206 travels through the wire wrapping pin 216 of a personality pin 218, through a wire 220, and then through a signal probe 222, respectively, before reaching the electronic component 212. The location of the personality pins and the signal probes as well as the length of their connecting wires changes depending upon the orientation of electronic components 212, 214 on the circuit board 202 under test.

Various ground paths also travel through the prior art board test fixture 204 between the circuit board 202 under test and the board test system 206. Ground connectors from the board test system 206 contact the bottom of the board test fixture 204 in order to make the ground path available to the fixture 204. At the bottom of the fixture 204 is the alignment plate 210, which serves as a focus means to capture and guide personality pins 218, which carry test signals, into an organized orthogonal array-like pattern when the alignment plate 210 is installed so that the board test system 206 can send test signals through the fixture 204.

The Cook patent provides an enhanced grounding system for a short-wire length test system. The enhanced system utilizes an internal ground plane 230 located in the test fixture and interposed between the probe plate 242 and alignment plate 210. The internal ground plane 230 is problematic in that it becomes difficult to align the ground plane during assembly of the test fixture. When the circuit to be tested is designed, a pattern of test points to be used in checking it is selected, and the corresponding array of test probes is configured in the test fixture. This typically involves drilling a pattern of holes in a probe plate to match the customized array of test probes and personality pins and then mounting the test probes and personality pins in the drilled holes on the probe plate. In Cook, a separated ground plane is provided, which requires a separate drilling step to align the personality pins and signal probes through the ground plane and corresponding probe plate. It is a difficult task to achieve the required perfect alignment and becomes even more difficult when dealing with high node count circuit board assemblies. Furthermore, Cook utilizes a detached ground plane which increases signal path lengths, adds weight and significantly reduces the overall space availability within the cavity of the board test fixture. An increased signal path length between the scanner and electronic circuit board also introduces both crosstalk and signal loss between connection points.

SUMMARY OF THE INVENTION

The present invention is an enhanced probe plate assembly contained in a standard circuit board test fixture. The probe plate assembly comprises conductive surface(s) laminated to the underside of a probe plate which are used for grounding, voltage sources, and common interconnection grids. By providing an integrated conductive surface or surfaces a separate drilling step and prior art alignment problems are eliminated. Holes drilled in a probe plate for personality pins and probe pins also result in perfectly aligned holes in the conductive surface, since the conductive surface is now directly attached to the probe plate.

Furthermore, the shortening of the signal path between the scanner and electronic circuit will ensure maximum signal quality, reduce weight, and significantly increase the overall space available within the cavity of the tester. Also, the ability to place conductive surfaces conveniently on the probe plate results in reduced length probe to personality pin hard wire connections and the flexibility of providing ground planes, voltage sources, and common interconnection grids anywhere on the probe plate. In fact, grounding planes, common interconnection grids, and voltage sources can coexist on one probe plate. This is accomplished by providing sections of conductive surface(s) throughout the underside of the probe plate.

BRIEF DESCRIPTION OF THE DRAWINGS

The invention is best understood from the following detailed description when read in connection with the accompanying drawings

DETAILED DESCRIPTION OF THE INVENTION

Figure 1:
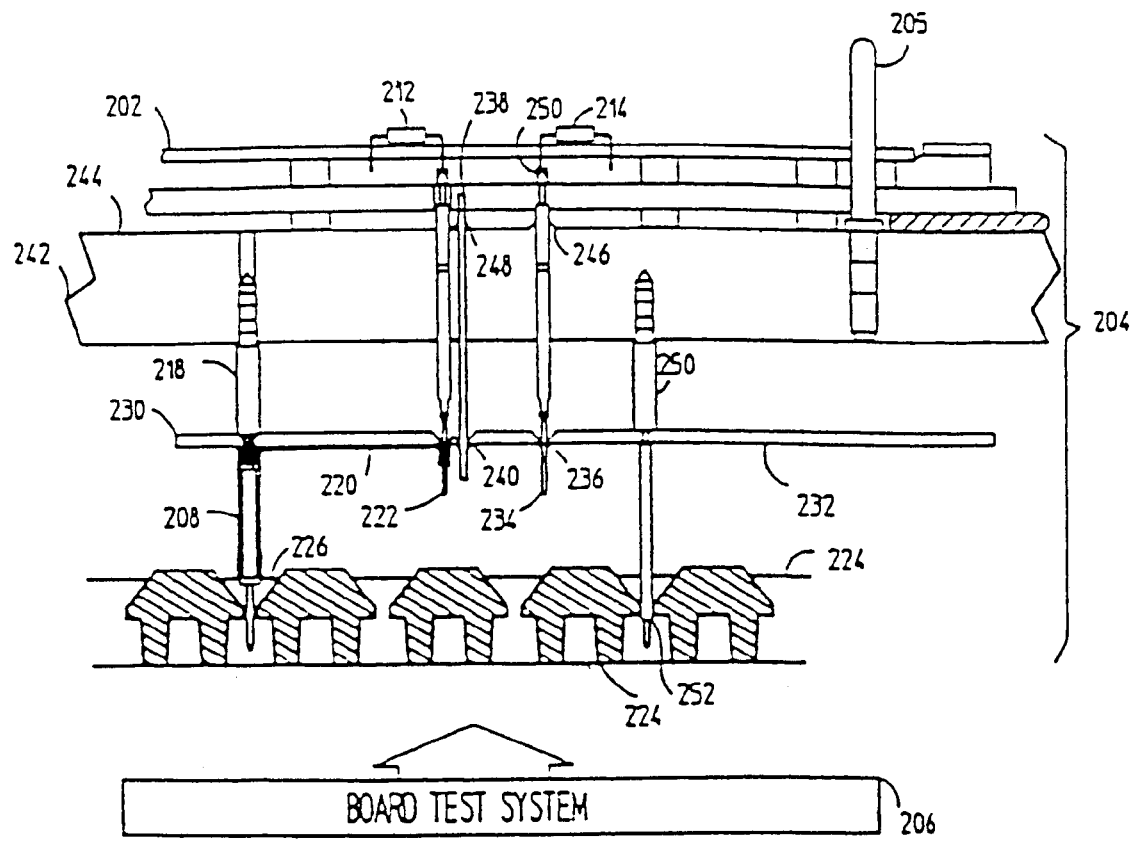
FIG. 1 depicts the prior art illustrating the separated ground plane 230.
Figure 2:
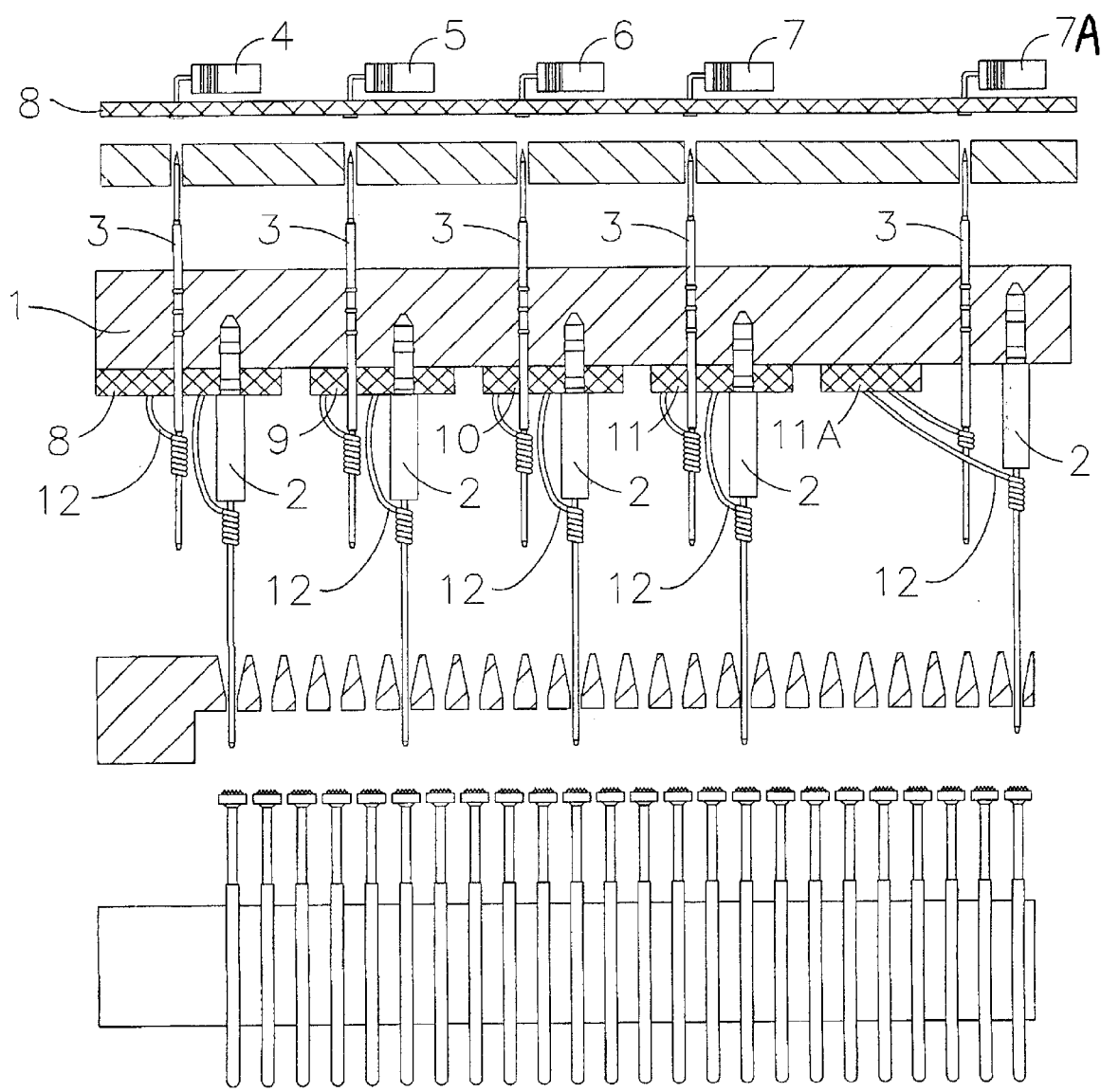
FIG. 2 depicts the probe plate assembly of applicant's invention illustrating the various conductive surface areas added thereon.
Figure 3:
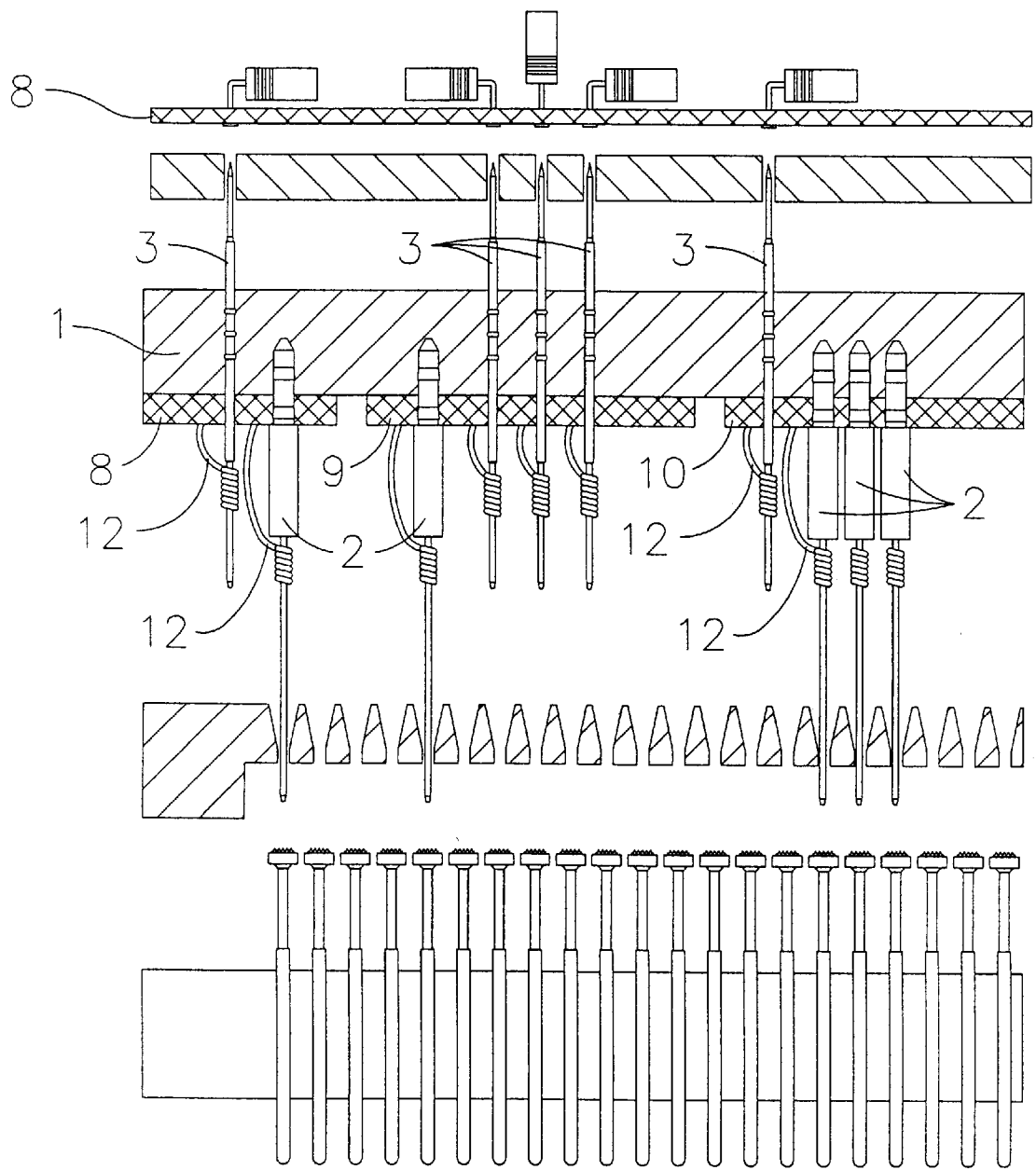
FIG. 3 illustrates alternative probe pin to personality pin connection scenarios of applicant's invention.

FIG. 2 illustrates the improved probe plate assembly of applicant's invention. The improved probe plate assembly is formed by adding a conductive surface or surfaces to a glass epoxy laminated probe plate 1. A tin coating of approximately 0.030 inches or less is applied over a probe plate 1 comprising a copper surfaced glass epoxy sheet. FIG. 2 Illustrates the probe plate assembly 1 with various conductive surface areas (8 through 11) added thereon. The location of the conductive surface areas is dependant on the location of personality pins 2 and signal probes 3. The location of personality pins 2 and signal probes 3 are dependent upon the orientation of electronic components 4,5,6,7 and 7A on the circuit board 8 under test. In the preferred embodiment personality pins 2 and signal probes 3 are inserted through holes located on the probe plate 1. The drilling of the probe plate 1 results in drilling through the conductive surface areas 8 through 11 which allows for perfect alignment of personality pins 2 and signal probes 3 through the probe plate 1 and conductive surface areas 8 through 11. However, it should be understood that personality pins 2 and signal probes 3 may be located adjacent to the conductive surface area as illustrated in FIG. 2 at conductive surface 11A. Conductive surfaces 8 through 11 interface to probe pins 2 and personality pins 3 by a wire 12. In the preferred embodiment, an insulating material is provided around probe pins 3 and personality pins 2 at their intersection with conductive surfaces 8 through 11. No insulating material is required for personality pin 2 and probe pin 3 at conductive surface 11A since these pins do not intersect the conductive surface at 11A. In another embodiment, no insulating material is provided around probe pin 2 and personality pin 3 at their intersection with conductive surfaces 8 through 11 thereby allowing the personality pins 2 and probe pins 3 to be soldered at the point of intersection with conductive surfaces 8 through 11. This embodiment eliminates the aforementioned problems associated with the use of separate wire interfaces to the conductive surfaces. FIG. 3 illustrates other connection scenarios between personality pins 2 and probe pins 3 through conductive surfaces 8 through 10. Referring to conductive surface 9 of FIG. 3 it is shown a single personality pin 2 interface to multiple probe pins 3. Referring to conductive surface 10 of FIG. 3, it is shown multiple personality pins 2 interfaced to a single probe pin 3.

It should be understood that the preceding is merely a detailed description of various embodiments of this invention and that numerous changes to these embodiments can be made in accordance with the disclosure herein without departing from the spirit or scope of the invention. Rather, the scope of the invention is to be determined only by the appended claims and their equivalents.

I claim:

1. A probe plate assembly in a circuit board test fixture which provides an interface between a circuit board under test and a board test system, comprising:
    at least one plate located in the test fixture, said plate having a top surface and a bottom surface;
    at least one conductive surface formed on said bottom surface of said plate;
    at least one first signal pin electrically connectable with one or more electronic components mounted on the circuit board under test and extending through said plate and said bottom conductive surface;
    at least one second signal pin electrically connectable with the board test system said second signal pin extending into said plate and through said bottom conductive surface;
    at least one interface electrically coupling said bottom conductive surface to said first signal pin and said second signal pin.

2. A probe plate assembly according to claim 1 wherein said bottom conductive surface is a ground plane.

3. A probe plate assembly according to claim 1 wherein said bottom conductive surface is a voltage source.

4. A probe plate assembly according to claim 1 wherein said bottom conductive surface is an interconnection grid.

5. A probe plate assembly according to claim 1 wherein a plurality of said bottom conductive surfaces comprise ground planes, voltage sources, and interconnection grids, said plurality of said bottom conductive surfaces being isolated from one another.

6. A probe plate assembly according to claim 1 wherein said interface is a wire.

7. A probe plate assembly according to claim 1 wherein said interface is a solder joint.

8. A probe plate assembly according to claim 7 wherein said solder joint is at the intersecting point of said bottom conductive surface with said first signal pin and said second signal pin.

9. A probe plate assembly according to claim 1 wherein said first signal pin and said second signal pin further comprise an insulating material at the intersecting point of said bottom conductive surface with said first signal pin and said second signal pin.

10. A probe plate assembly in a circuit board test fixture which provides an interface between a circuit board under test and a board test system, comprising:
    at least one plate located in the test fixture;
    at least one conductive surface formed on a surface of said plate;
    at least one first signal pin electrically connectable with one or more electronic components mounted on the circuit board under test and extending through said plate and said conductive surface;
    at least one second signal pin electrically connectable with the board test system said second signal pin extending into said plate and through said conductive surface;
    at least one interface electrically coupling said conductive surface to said first signal pin and said second signal pin, wherein said interface is a solder point, said solder joint at the intersecting point of said conductive surface with said first signal pin and said second signal pin.

11. A probe plate assembly in a circuit board test fixture which provides an interface between a circuit board under test and a board test system, comprising:
    at least one plate located in the test fixture;
    at least one conductive surface formed on a surface of said plate;
    at least one first signal pin electrically connectable with one or more electronic components mounted on the circuit board under test and extending through said plate and said conductive surface;
    at least one second signal pin electrically connectable with the board test system said second signal pin extending into said plate and through said conductive surface;

at least one interface electrically coupling said conductive surface to said first signal pin and said second signal pin, wherein said first signal pin and said second signal pin further comprise an insulating material at the intersecting point of said conductive surface with said first signal pin and said second signal pin.

* * * * *